United States Patent
Ding et al.

(10) Patent No.: US 7,088,143 B2
(45) Date of Patent: Aug. 8, 2006

(54) DYNAMIC CIRCUITS HAVING IMPROVED NOISE TOLERANCE AND METHOD FOR DESIGNING SAME

(75) Inventors: Li Ding, Sunnyvale, CA (US); Pinaki Mazumder, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 62 days.

(21) Appl. No.: 10/847,018

(22) Filed: May 17, 2004

(65) Prior Publication Data

US 2005/0007153 A1   Jan. 13, 2005

Related U.S. Application Data

(60) Provisional application No. 60/472,651, filed on May 22, 2003.

(51) Int. Cl.
  *H03K 19/096* (2006.01)
  *H03K 19/00* (2006.01)
  *H03K 19/20* (2006.01)
  *H03K 19/094* (2006.01)

(52) U.S. Cl. ............ 326/98; 326/93; 326/112; 326/119; 326/121

(58) Field of Classification Search ........... 326/98, 326/93, 112, 119, 121
See application file for complete search history.

(56) References Cited

U.S. PATENT DOCUMENTS

| | | |
|---|---|---|
| 4,570,084 A | 2/1986 | Griffin et al. |
| 4,797,580 A | 1/1989 | Sunter |
| 5,065,048 A | 11/1991 | Asai et al. |
| 5,294,566 A | 3/1994 | Mori |
| 5,483,181 A | 1/1996 | D'Souza |
| 5,650,733 A | 7/1997 | Covino |
| 5,793,228 A | 8/1998 | Evans |
| 5,818,264 A | 10/1998 | Ciraula et al. |
| 5,838,169 A | 11/1998 | Schorn |
| 5,903,170 A * | 5/1999 | Kulkarni et al. ............ 326/134 |
| 6,002,292 A | 12/1999 | Allen et al. |
| 6,111,434 A | 8/2000 | Ciraula et al. |
| 6,130,559 A | 10/2000 | Balsara et al. |
| 6,204,696 B1 | 3/2001 | Krishnamurthy et al. |
| 6,255,854 B1 | 7/2001 | Houston |
| 6,323,709 B1 | 11/2001 | Kulkarni et al. |
| 6,346,831 B1 | 2/2002 | Krishnamurthy et al. |
| 6,353,339 B1 | 3/2002 | Klass |
| 6,366,134 B1 * | 4/2002 | Deng ............................ 326/95 |
| 6,535,041 B1 | 3/2003 | Bucki et al. |
| 6,686,631 B1 * | 2/2004 | King et al. ................ 257/369 |

OTHER PUBLICATIONS

Larsson, P., et al, Noise in Digital Dynamic CMOS Circuits, IEEE Journal of Solid-State Circuits, vol. 29, No. 6, Jun. 1994, pp. 655-662.

(Continued)

*Primary Examiner*—Rexford Barnie
*Assistant Examiner*—Jason Crawford
(74) *Attorney, Agent, or Firm*—Brooks Kushman P.C.

(57) ABSTRACT

A number of different dynamic circuits having improved noise tolerance and a method for designing same are provided. The circuits include a power supply node and a precharge node. Keeper circuitry is connected to the nodes and has a current-voltage characteristic that exhibits a negative differential resistance property to improve noise tolerance of the circuits.

21 Claims, 4 Drawing Sheets

OTHER PUBLICATIONS

Shepard, K.L., et al., Noise in Deep Submicron Digital Design, in Proc. International Conference on Computer Aided Design, 1996, pp. 524-531, no month.

Krambeck, R.H., et al., High-Speed Compact Circuits with CMOS, IEEE Journal of Solid-State Circuits, vol. SC-17, No. 3, Jun. 1982, pp. 614-619.

Oklobdziga, V.G., et al., Design-Performance Trade-Offs in CMOS Domino Logic, in Proc. IEEE Custom Integrated Circuits Conference, May 1986, pp. 304-306.

Allam, Mohammed, et al., High-Speed Dynamic Logic Styles for Scaled-Down CMOS and MTCMOS Technologies, in Proc. Int. Symp. Low Power Electronics and Design, 2000, pp. 155-160, no month.

Anis, M.H., et al., Energy-Efficient Noise Tolerant Dynamic Styles for Scaled-Down CMOS and MTCMOS Technologies, IEEE Transactions on VLSI Systems, vol. 10, No. 2, Apr. 2002, pp. 71-78.

Alvandpour, A., et al., A Conditional Keeper Technique for Sub-0.13µ Wide Dynamic Gates, in Proc. Int. Symp. VLSI Circuits, 2001, pp. 29-30, no month.

Alvandpour, A., et al., A Sub-130-nm Conditional Keeper Technique, IEEE Journal of Solid-State Circuits, vol. 37, No. 5, May 2002, pp. 633-638.

Lee, C.M., et al., Zipper CMOS, IEEE Circuits and Devices Magazine, vol. 2, May 1986, pp. 10-17.

Pretorius, J.A., et al., Charge Redistribution and Noise Margins in Domino CMOS Logic, IEEE Transacations on Circuits and Systems, vol. CAS-33, No. 8, Aug. 1986, pp. 786-793.

Wang, L., et al., Noise-Tolerant Dynamic Circuit Design, in Proc. International Symposium on Circuits and Systems, 1999, pp. I 549-552, no month.

Wang, L., et al., An Energy-Efficient Noise-Tolerant Dynamic Circuit Technique, IEEE Transactions on Circuits and Systems II, vol. 47, No. 11, 2000, pp. 1300-1306, no month.

Balamurugan, G., et al., Energy-Efficient Dynamic Circuit Design in the Presence of Crosstalk Noise, in Proc. International Symposium on Low Power Electronics and Design, 1999, pp. 24-29, no month.

Balamurugan, G., et al., The Twin-Transistor Noise-Tolerant Dynamic Circuit Technique, IEEE Journal of Solid-State Circuits, vol. 36, No. 2, Feb. 2001, pp. 273-280.

Murabayashi, F., et al., 2.5 V CMOS Circuit Techniques for a 200 MHz Superscalar RISC Processor, IEEE Journal of Solid-State Circuits, vol. 31, No. 7, Jul. 1996, pp. 972-980.

Bobba, S., et al., Design of Dynamic Circuits with Enhanced Noise Tolerance, in Proc. IEEE International ASIC/SOC Conference, 1999, pp. 54-58, no month.

Wu, C.Y., et al., Integrated A-Type Differential Negative Resistance MOSFET Device, IEEE Journal of Solid-State Circuits, vol. SC-14, No. 6, Dec. 1979, pp. 1094-1101.

Wu, C.Y., et al., The New General Realization Theory of FET-Like Integrated Voltage-Controlled Negative Differential Resistance Devices, IEEE Transactions on Circuits and Systems, vol. CAS-28, No. 5, May 1981, pp. 382-390.

Chua, L.O., et al., Bipolar-JFET-MOSFET Negative Resistance Devices, IEEE Transactions on Circuits and Systems, vol. CAS-32, No. 1, Jan. 1985, pp. 46-61.

NG., K.K., A Survey of Semiconductor Devices, IEEE Transactions on Electron Devices, vol. 43, No. 10, Oct. 1996, pp. 1760-1766.

Heller, L.G., et al., Cascode Voltage Switch Logic: A Differential CMOS Logic Family, in Proc. International Solid-State Circuit Conference, Feb. 1984, pp. 16-17.

Bhattacharya, M., et al., Noise Margins of Threshold Logic Gates Containing Resonant Tunneling Diodes, IEEE Transactions on Circuits and Systems II, vol. 47, No. 10, 2000, pp. 1080-1085, no month.

Sun, J.P., et al., Resonant Tunneling Diodes: Models and Properties, Proceedings of the IEEE, vol. 86, No. 4, Apr. 1998, pp. 641-661.

Mazumder, P., et al., Digital Circuit Applications of Resonant Tunneling Devices, Proceedings of the IEEE, vol. 86, No. 4, Apr. 1998, pp. 664-686.

Chen, K.J., et al., A Novel Ultrafast Functional Device: Resonant Tunneling High Electron Mobility Transistor, in Proc. IEEE Electron Devices Meeting, 1996, pp. 60-63, no month.

Stock, J., et al., A Vertical Resonant Tunneling Transistor for Application in Digital Logic Circuits, IEEE Transactions on Electron Devices, vol. 48, No. 6, Jun. 2001, pp. 1028-1032.

Mohan, S., et al., Device and Circuit Simulation of Quantum Electronic Devices, IEEE Transactions on Computer-Aided Design of Integrated Circuits and Systems, vol. 14, No. 6, Jun. 1995, pp. 653-662.

Daga, J.M., et al., A Comprehensive Delay Macro Modeling for Submicrometer CMOS Logics, IEEE Journal of Solid-State Circuits, vol. 34, No. 1, Jan. 1999, pp. 42-55.

Murabayashi, F., et al., 2.5 V Novel CMOS Circuit Techniques for a 150 MHz Superscalar RISC Processor, in Proc. European Solid-State Circuits Conference, pp. 178-181, 1995, no month.

* cited by examiner

DYNAMIC CIRCUITS HAVING IMPROVED NOISE TOLERANCE AND METHOD FOR DESIGNING SAME

CROSS-REFERENCE TO RELATED APPLICATION

This application claims the benefit of U.S. provisional application Ser. No. 60/472,651, filed May 22, 2003 and entitled "Method and Apparatus to Improve Noise Tolerance of Dynamic Circuits."

STATEMENT REGARDING FEDERALLY SPONSORED RESEARCH OR DEVELOPMENT

This invention was made with Government support from the Office of Naval Research and the National Science Foundation. The Government has certain rights in the invention.

BACKGROUND OF THE INVENTION

1. Field of the Invention

This invention relates to dynamic circuits having improved noise tolerance and methods for designing same. Such dynamic circuits include both combinational and sequential dynamic CMOS logic circuits.

2. Background Art

Dynamic CMOS logic circuits are widely employed in high-performance VLSI chips in pursuing very high system performance. However, dynamic CMOS gates are inherently less resistant to noises than static CMOS gates. With the increasing stringent noise requirement due to aggressive technology scaling, the noise tolerance of dynamic circuits has to be first improved for the overall reliable operation of VLSI chips designed using deep submicron process technology. In the literature, a number of design techniques have been proposed to enhance the noise tolerance of dynamic logic gates.

The following publications are related to this invention, some of which are referenced herein:

[1] P. Larsson et al., "Noise in Digital Dynamic CMOS Circuits," IEEE JOURNAL OF SOLID-STATE CIRCUITS, Vol. 29, No. 6, pp. 655–662, June 1994.

[2] K. L. Shepard et al., "Noise in Deep Submicron Digital Design," in Proc. INTERNATIONAL CONFERENCE ON COMPUTER AIDED DESIGN, pp. 524–531, 1996.

[3] R. H. Krambeck et al., "High-Speed Compact Circuits with CMOS," IEEE JOURNAL OF SOLID-STATE CIRCUITS, Vol. SC-17, No. 3, pp. 614–619, June 1982.

[4] V. G. Oklobdziga et al., "Design-Performance Trade-Offs in CMOS Domino Logic," in Proc. IEEE CUSTOM INTEGRATED CIRCUITS CONFERENCE, pp. 334–337, May 1985.

[5] M. H. Anis et al., "High-Speed Dynamic Logic Styles for Scaled-Down CMOS and MTCMOS Technologies," in Proc. INT. SYMP. LOW POWER ELECTRONICS AND DESIGN, pp. 155–160, 2000.

[6] M. H. Anis et al., "Energy-Efficient Noise Tolerant Dynamic Styles for Scaled-Down CMOS and MTCMOS Technologies," IEEE TRANSACTIONS ON VLSI SYSTEMS, Vol. 10, No. 2, pp. 71–78, April 2002.

[7] A. Alvandpour et al., "A Conditional Keeper Technique for Sub-0.13µ Wide Dynamic Gates," in Proc. INT. SYMP. VLSI CIRCUITS, pp. 29–30, 2001.

[8] A. Alvandpour et al., "A Sub-130-nm Conditional Keeper Technique," IEEE JOURNAL OF SOLID-STATE CIRCUITS, Vol. 37, No. 5, pp. 633–638, May 2002.

[9] C. M. Lee et al., "Zipper CMOS," IEEE CIRCUITS AND DEVICES MAGAZINE, Vol. 2, pp. 10–17, May 1986.

[10] J. A. Pretorius et al., "Charge Redistribution and Noise Margins in Domino CMOS Logic," IEEE TRANSACTIONS ON CIRCUITS AND SYSTEMS, Vol. CAS-33, No. 8, pp. 786–793, August 1986.

[11] G. P. D'Souza, "Dynamic Logic Circuit with Reduced Charge Leakage," U.S. Pat. No. 5,483,181, January 1996.

[12] E. B. Schorn, "NMOS Charge-Sharing Prevention Device for Dynamic Logic Circuits," U.S. Pat. No. 5,838,169, November 1998.

[13] L. Wang et al., "Noise-Tolerant Dynamic Circuit Design," in Proc. INTERNATIONAL SYMPOSIUM ON CIRCUITS AND SYSTEMS, pp. I 549–552, 1999.

[14] L. Wang et al., "An Energy-Efficient Noise-Tolerant Dynamic Circuit Technique," IEEE TRANSACTIONS ON CIRCUITS AND SYSTEMS II, Vol. 47, No. 11, pp. 1300–1306, November 2000.

[15] G. Balamurugan et al., "Energy-Efficient Dynamic Circuit Design in the Presence of Crosstalk Noise," in Proc. INTERNATIONAL SYMPOSIUM ON LOW POWER ELECTRONICS AND DESIGN, pp. 24–29, 1999.

[16] G. Balamurugan et al., "The Twin-Transistor Noise-Tolerant Dynamic Circuit Technique," IEEE JOURNAL OF SOLID-STATE CIRCUITS, Vol. 36, No. 2, pp. 273–280, February 2001.

[17] F. Murabayashi et al., "2.5 V Novel CMOS Circuit Techniques for a 150 MHz Superscalar RISC Processor," in Proc. EUROPEAN SOLID-STATE CIRCUITS CONFERENCE, pp. 178–181, 1995.

[18] F. Murabayashi et al., "2.5 V CMOS Circuit Techniques for a 200 MHz Superscalar RISC Processor," IEEE JOURNAL OF SOLID-STATE CIRCUITS, Vol. 31, No. 7, pp. 972–980, July 1996.

[19] J. J. Covino, "Dynamic CMOS Circuits with Noise Immunity," U.S. Pat. No. 5,650,733, July 1997.

[20] D. A. Evans, "Noise-Tolerant Dynamic Circuits," U.S. Pat. No. 5,793,228, August 1998.

[21] S. Bobba et al., "Design of Dynamic Circuits with Enhanced Noise Tolerance," in Proc. IEEE INTERNATIONAL ASIC/SOC CONFERENCE, pp. 54–58, 1999.

[22] C.-Y. Wu et al., "Integrated A-Type Differential Negative Resistance MOSFET Device," IEEE JOURNAL OF SOLID-STATE CIRCUITS, Vol. SC-14, No. 6, pp. 1094–1101, December 1979.

[23] C.-Y. Wu et al., "The New General Realization Theory of FET-Like Integrated Voltage-Controlled Negative Differential Resistance Devices," IEEE TRANSACTIONS ON CIRCUITS AND SYSTEMS, Vol. CAS-28, No. 5, pp. 382–390, May 1981.

[24] L. O. Chua et al., "Bipolar-JFET-MOSFET Negative Resistance Devices," IEEE TRANSACTIONS ON CIRCUITS AND SYSTEMS, Vol. CAS-32, No. 1, pp. 46–61, January 1985.

[25] K. K. Ng, "A Survey of Semiconductor Devices," IEEE TRANSACTIONS ON ELECTRON DEVICES, Vol. 43, No. 10, pp. 1760–1766, October 1996.

[26] L. G. Heller et al., "Cascode Voltage Switch Logic: A Differential CMOS Logic Family," in Proc. INTERNATIONAL SOLID-STATE CIRCUIT CONFERENCE, pp. 16–17, February 1984.

[27] M. Bhattacharya et al., "Noise Margins of Threshold Logic Gates Containing Resonant Tunneling Diodes,"

[28] J. P. Sun et al., "Resonant Tunneling Diodes: Models and Properties," PROCEEDINGS OF THE IEEE, Vol. 86, No. 4, pp. 641–660, April 1998.

[29] P. Mazumder et al., "Digital Circuit Applications of Resonant Tunneling Devices," PROCEEDINGS OF THE IEEE, Vol. 86, No. 4, pp. 664–686, April 1998.

[30] K. J. Chen et al., "A Novel Ultrafast Functional Device: Resonant Tunneling High Electron Mobility Transistor," in Proc. IEEE ELECTRON DEVICES MEETING, pp. 60–63, 1996.

[31] J. Stock et al., "A Vertical Resonant Tunneling Transistor for Application in Digital Logic Circuits," IEEE TRANSACTIONS ON ELECTRON DEVICES, Vol. 48, No. 6, pp. 1028–1032, June 2001.

[32] S. Mohan et al., "Device and Circuit Simulation of Quantum Electronic Devices," IEEE TRANSACTIONS ON COMPUTER-AIDED DESIGN OF INTEGRATED CIRCUITS AND SYSTEMS, Vol. 14, No. 6, pp. 653–662, June 1995.

[33] S. K. Sunter, "Current-Mirror-Biased Pre-Charged Logic Circuit," U.S. Pat. No. 4,797,580, January 1989.

[34] J. M. Daga et al., "A Comprehensive Delay Macro Modeling for Submicrometer CMOS Logics," IEEE JOURNAL OF SOLID-STATE CIRCUITS, Vol. 34, No. 1, pp. 42–55, January 1999.

The following U.S. patents are also related to this invention: U.S. Pat. Nos. 4,570,084; 5,065,048; 5,294,566; 5,818,264; 5,903,170; 6,002,292; 6,111,434; 6,130,559; 6,204,696; 6,255,854; 6,323,709; 6,346,831; 6,353,339; and 6,535,041.

Digital integrated circuit noise has become one of the foremost issues in the design of very deep submicron VLSI chips [1]–[2]. Noise in digital integrated circuits refers to any phenomenon that causes the voltage at a node to deviate from its nominal value. While these noises always existed, in the past they had little impact on the performance of integrated circuits and were often neglected. It is the unstopped aggressive technology scaling in an effort to continuously improve chip performance and integration level that makes noise play an increasingly important role in comparison with conventional design metrics like area, speed and power consumption.

Together with technology scaling, aggressive design practices like employing dynamic logic styles have also seen wider use in recent years to achieve higher performance of integrated circuits. Circuits designed using dynamic logic styles can be considerably faster and more compact than their static CMOS counterparts. This is especially the case with wide fan-in dynamic logic gates where a single gate can realize the logic function that otherwise would require multiple-levels of static CMOS logic gates. Therefore, wide fan-in dynamic gates are routinely employed in performance-critical blocks of high-performance chips, such as a microprocessor, digital signal processor, and so on.

Criticism on dynamic circuits is often related to their relatively poor noise tolerance. The switching threshold voltage of a dynamic CMOS logic gate, defined as the input voltage level at which the gate output changes state, is usually the transistor threshold voltage $V_T$. In comparison, the switching threshold voltage of static CMOS logic gate is typically around half the supply voltage. Therefore, dynamic logic gates inherently have less noise immunity than static CMOS logic gates and are the weak link in a high-performance VLSI chip designed using deep submicron process technology.

A number of design techniques have been developed in the past two decades in an effort to reinforce this weak link. For example, feedback keepers were proposed to prevent the dynamic node from floating; internal nodes were precharged to eliminate the charge sharing problem; and weak complementary p-network were constructed to improve the noise tolerance to the level of skewed static CMOS logic gates. However, existing remedial techniques improve dynamic circuit noise tolerance at a significant cost in terms of one or more other important design metrics like circuit area, speed, and power consumption. The fact is that the amount of overhead increases dramatically when the noise tolerance requirement is increased along with the continuous downscaling of the process technology. Therefore, effective noise-tolerant design techniques that incur little overhead in silicon area, circuit speed and power consumption are highly demanded.

Noise in Dynamic Logic Circuits

A typical n-type domino CMOS logic gate consists of clock controlled transistors M1 and M2, a pull-down n-type transistor network, and an output driver. The operation of a domino CMOS logic gate can be divided into two phases. In the precharge phase when the clock CK is low, the dynamic node S is charged to logic high through M1 and the output of the gate Q is low. The evaluation phase starts when the clock goes high. In this phase, M1 is OFF and M2 is ON. The dynamic node S discharges or retains its charge depending on the inputs to the pull-down network.

Noise sources in dynamic logic circuits can be broadly classified into two basic types: i) gate internal noises, including charge sharing noise, leakage noise, and so on; and ii) external noises, including input noise, power and ground noise, and substrate noise.

Charge sharing noise is caused by charge redistribution between the dynamic node and the internal nodes of the pull-down network. Charge sharing reduces the voltage level at the dynamic node causing potential false switching of a dynamic logic gate.

Leakage noise refers to the possible charge loss in the evaluation phase due to sub-threshold leakage current. Leakage current increases exponentially with respect to transistor threshold voltage, which is continuously being downscaled as the power supply voltage reduces. Therefore, leakage in transistors can be a significant source of noise in wide dynamic logic gates designed using very deep submicron process technology.

Input noise refers to noise presented at the inputs of a logic gate. They are primarily caused by the coupling effect, also known as a crosstalk, among adjacent signal wires. This type of noise has become a prominent source of failures for deep submicron VLSI circuits because of the aggressive interconnect scaling in the lateral dimensions with relatively unchanged vertical dimensions.

Power and ground noise is mainly caused due to the parasitic resistance and inductance at the power and ground networks and at the chip package. Power and ground networks can also be contaminated by external noises from chip pins. Besides obviously reducing gate noise margin due to possibly lowered supply voltage, the power and ground voltage mismatch between a driver gate and a receiver gate can translate to a DC noise at the input of the receiver.

Substrate noise can affect the signal integrity of a logic gate through substrate coupling. Furthermore, since transistor threshold voltage is a function of the substrate voltage, noise in the substrate can momentarily lower the threshold voltage of the transistors in the pull-down network rendering them more susceptible to other noises.

In all, those noises, together with other sources of disturbance like process variation, alpha particle radiation, and so on, can endanger the correct function of dynamic logic circuits designed using very deep submicron process technology. And a desired noise-tolerant design technique should be able to improve the noise immunity of dynamic logic gates against all aforementioned noises.

Overview of Previous Work

In the past two decades, a number of circuit techniques have been developed with a view to improve the noise immunity of dynamic CMOS logic gates. An overview of some significant techniques is described hereinbelow. The techniques are classified into four main categories based on the principle of their operations: 1) using a keeper; 2) precharging internal nodes; 3) raising source voltage; and 4) constructing a complementary p-network.

Employing Keeper

Perhaps the simplest way to enhance the noise tolerance of dynamic CMOS logic gates is to employ a weak transistor, known as keeper, at the dynamic node. The keeper transistor supplies a small amount of current from the power-supply network to the dynamic node of a gate so that the charge stored in the dynamic mode is maintained. In the original domino dynamic logic work [3], the gate of the PMOS keeper is tied to the ground. Therefore, the keeper is always on. Later, feedback keepers (i.e., FIG. 1) became more widely used because they eliminate the potential DC power consumption problem using the always-on keeper in the evaluation phase of domino gates [4].

The use of a keeper causes contention when the pull-down network is O$_N$ during the evaluation phase, resulting in slower overall gate performance. In wide fan-in gates designed using very deep submicron process technology, the large leakage current through the n-network necessitates a very strong keeper to retain the voltage at the dynamic node. To reduce the serious contention problem associated with the strong keeper, new keeper design techniques have been recently proposed by Anis et al. in [5]–[6] and Alvandpour et al. in [7]–[8]. Both techniques share the same basic principle, that is, to temporarily disable the keeper during the small time window when the dynamic gate switches. These two techniques have been shown to be very effective in enhancing the noise tolerance of dynamic gates against gate internal noises like leakage noise. However, dynamic gates with those keepers are still susceptible to external noise glitches because the dynamic node is not adequately protected during the gate switching time window.

Figure 1:
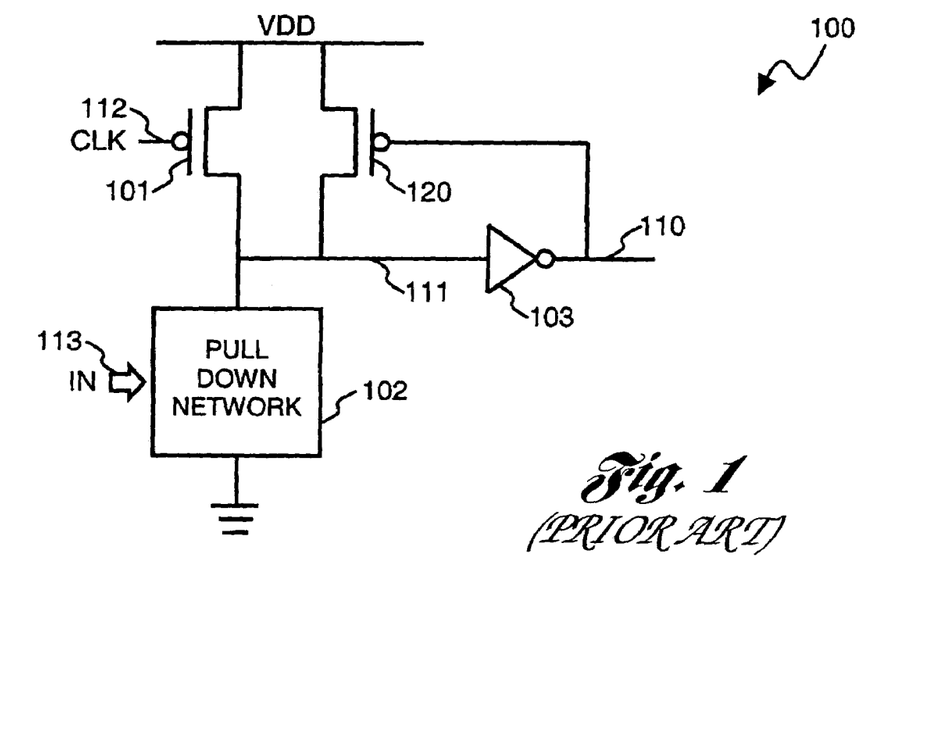
FIG. 1 is a circuit diagram of a prior art keeper circuit using a MOS pull-up device and a feedback inverter.

Referring specifically now to FIG. 1, a typical n-type domino CMOS logic gate, generally indicated at 100, includes a clock-controlled p-type Field-Effect Transistor (FET) 101, a pull-down n-type transistor network 102, and an output driver 103. The operation of the domino CMOS logic gate 100 can be divided into two phases. In the precharge phase when the clock CLK (i.e. 112) is low, the dynamic node 111 is charged to logic high through precharge transistor 101 and the output 110 of the gate 100 is low. The evaluation phase starts when the clock CLK (i.e. 112) goes high. In this phase, the precharge transistor 101 is O$_{FF}$. The dynamic node 111 discharges or retains its charge depending on the inputs 113 to the pull-down network 102.

A commonly used prior keeper implementation to improve dynamic circuit noise tolerance is included in the circuit 100. This feedback keeper implementation employs a p-type pull-up transistor 120 whose gate terminal is connected to the output 110 of the gate 100. In the precharge phase, gate output node 110 is in the logical 0 state. Therefore, the pull-up transistor 120 is O$_N$ which helps to retain the charge at the dynamic node 111. In the evaluation phase, if the pull-down network 102 is not fully O$_N$, the same pull-up current fights against any noise induced lose in charge at the dynamic node 111. If, on the other hand, the pull-down network 102 is fully O$_N$ in a regular gate switching operation, the voltage level at the dynamic node 111 decreases and the gate output 110 rises. When the voltage level at gate output 110 is higher than the power supply voltage less the threshold voltage of the pull-up transistor 120, the pull-up transistor 120 is turned off, allowing the dynamic node 111 to be fully discharged to the ground voltage level.

This prior feedback keeper technique is effective against noises and is easy to design. However, there is a fundamental dilemma in choosing the size of the keeper. On one hand, a strong keeper is required to achieve high gate noise tolerance. On the other hand, large keeper leads to significant contention during normal gate switching operation, and therefore deteriorates gate performance.

Precharging Internal Nodes

In complex dynamic logic gates with a large pull-down network, charge sharing between the dynamic node and the internal nodes in the pull-down network often results in false gate switching. A simple yet effective way to prevent the charge sharing problem is to precharge the internal nodes in the pull-down network along with precharging the dynamic node S [9], [10]. When all internal nodes are precharged, this technique is able to eliminate the charge sharing problem at the cost of using a large number of precharge transistors and the increased load capacitance on the clock net. Partial precharge has also been used in design practice as a tradeoff between noise immunity and overheads in chip area and in clock load. NMOS transistors can also be used to precharge the internal nodes if the cost of an inverter to generate the complementary clock signal can be justified. Since the internal nodes are only precharged to $V_{DD}$–$V_T$, dynamic logic gates using NMOS precharge transistors have reduced discharging time and decreased dynamic power consumption. Finally, it is noted that techniques based on precharging internal nodes alone are not very effective against external noises.

Raising Source Voltage

One effective way to improve noise tolerance against both internal and external noises is to increase the source voltage of the transistors in the pull-down network. Since the gate voltage has to be greater than the sum of the source voltage and the transistor threshold voltage when a transistor is turned on, higher source voltage directly leads to increased gate turn-on voltage. Furthermore, due to the body effect, transistor threshold voltage is increased when the source voltage rises. This also contributes to improving gate turn-on voltage.

The PMOS pull-up advantage [11] employs a PMOS transistor at node N2 forming a resistive voltage divider with the bottom clock-controlled transistor. The voltage at node N2, which determines the switching threshold voltage of the dynamic logic gate, can be adjusted by changing the relative size of the PMOS pull-up transistor. One major drawback of this technique is the DC power consumption in the resistive voltage divider. Furthermore, since the voltage level at the dynamic node S can never get lower than the voltage at node N2, the voltage swing at node S is not rail-to-rail. When the size of the PMOS pull-up transistor is large in an effort to aggressively raise gate noise immunity, the gate output may also not have a rail-to-rail swing.

An improved method employs a pull-up transistor with feedback control [12]. Here, an NMOS transistor M1 is used to pull up the voltage of an internal node. The gate of the pull-up transistor is connected to the dynamic node of the domino gate. This design allows the pull-up transistor to be shut off when the voltage of the dynamic node goes low, therefore, the dynamic node S undergoes rail-to-rail voltage swing. Also, the DC power consumption problem is partially solved. It occurs only under certain input combinations that do not turn on the pull-down network. A PMOS transistor can similarly be used in this technique provided that the gate of the PMOS transistor is connected to the output of the dynamic logic gate.

The mirror technique [13], [14] employs a feedback-controlled NMOS transistor similar to the NMOS pull-up technique. In addition, it duplicates the pull-down network in an effort to further reduce DC power consumption and to further improve gate noise tolerance. Whenever the pull-down network is OFF, the mirror network is also OFF, hence, cutting off the potential DC conducting path from the NMOS pull-up transistor through the bottom clock-controlled transistor. Therefore, the DC power consumption problem is completely solved. However, this technique significantly lengthens the discharge path in the pull-down network, which potentially leads to slower circuit or considerably increased circuit active area when the transistors are aggressively sized.

The twin transistor technique [15], [16] adopts NMOS pull-up transistors at all internal nodes to further improve dynamic gate noise immunity. In addition, the drain nodes of the pull-up NMOS transistors are connected to the inputs instead of to the power supply network. By doing so, unnecessary injection of current by the pull-up transistors is avoided, resulting in lower gate power consumption. However, this technique leads to increased gate input capacitance which may slow down the switching of the gates in the previous stage. Further, this technique is not suitable for certain logic functions because it may short input nodes.

Constructing Complementary p-Network

The basic principle of this class of techniques is to construct a weak complementary p-network to prevent the dynamic node from floating in the evaluation phase. In one such technique [17], [18], a gate operates in a similar way as a normal domino gate in the precharge phase. In the evaluation phase, the logic gate behaves as a skewed CMOS logic gate. Therefore, the switching threshold voltage of the dynamic logic gate is equivalent to that of a skewed CMOS logic gate. In addition to the silicon area overhead associated with the pull-up network, a major drawback of this technique in practice is its ineffectiveness in dealing with very wide logic gates, for example, wide OR gates, where dynamic logic styles really outshine static CMOS logic gates in performance.

PMOS transistors can also be employed at a per transistor level. This technique is known as CMOS inverter technique [19]. The relative size of the PMOS transistors can be varied to adjust the switching threshold of the dynamic logic gate. One advantage of this technique is that it can be selectively applied to a subset of inputs if they can be identified as noisy in advance. The main drawback of this technique is that it is not suitable for OR type logic gates because of possible serious DC currents under certain input combinations. The simple 3-input OR-AND gate will be used as an example. When inputs A and C are high and input B is low, there is a direct conducting path between the power supply network and the ground node. More hazardous than the obvious problem of DC power consumption, the voltage at node S is determined by the relative strength of the pull-up transistor M2 and that of the transistors in the discharge path. The gate may fail to switch when the pull-up transistor is sized relatively strong in an effort to aggressively improve gate noise tolerance.

The dynamic node can be false reset with certain input combinations using either of the two above techniques. With a view to solve this false reset problem, Evans in [20] used an additional transistor M3. M3 is ON when the gate output remains low. When the evaluation is executed and the output rises, M3 is turned OFF disconnecting the pull-up transistors from the power supply network. Similar tactic can also be applied to improve the simple complementary p-network technique. This gated CMOS inverter technique does not completely solve the DC conducting problem for certain logic circuits.

A noise-tolerant 2-input AND gate using a triple transistor technique has been provided [21], where each NMOS transistor in the pull-down network of a simple dynamic logic gate is replaced by three transistors. The technique can be considered as a variation of the CMOS inverter technique where an additional NMOS transistor is used to prevent the possible DC conducting path problem in the evaluation phase. Similar to the mirror technique, this technique significantly lengthens discharge paths in the pull-down network. While it can be useful for certain logic gates like wide-OR gates, it is not practical to be applied to general pull-down NMOS network because of its overhead in circuit area and performance.

Comparison of Techniques

In this subsection, the noise-tolerant design techniques described in the previous subsections are compared. A listing of the set of basic requirements that a desirable noise-tolerant design technique should meet is as follows:
1. It improves gate noise tolerance against all types of noises.
2. It is suitable for all logic functions.
3. It has minimal circuit area overhead.
4. It has minimal circuit speed overhead.
5. It consumes no DC power and has minimal AC power consumption overhead.

Dynamic circuit noise enhancing techniques discussed in this section are compared in Table 1. The first three columns are self-explanatory. The fourth column is the approximate number of transistors needed in a large dynamic logic gate, where N is the number of transistors in the pull-down network of the original dynamic logic gate. The fifth and sixth columns indicate whether the input load capacitance and clock load capacitance are unchanged when a noise-tolerant design technique is used. The seventh column shows whether the length of the discharge paths in the pull-down network is intact. The eighth column indicates whether the dynamic gate maintains the zero DC power consumption property. The ninth column shows whether the technique enhances noise tolerance against both internal and external noises. And finally, the last column shows whether the technique can be applied to all logic gates.

It is shown in the table that the twin transistor technique and CMOS inverter based techniques are not suitable for all logic functions. Techniques based on precharging internal nodes as well as the two new feedback keeper techniques only improve gate noise immunity against certain types of noises. Both the PMOS pull-up technique and the NMOS pull-up (with feedback) technique consumes DC power. The mirror technique and the triple transistor technique increase the length of gate discharge path. Techniques based on raising source voltage usually either have DC power consumption or require significantly larger silicon area. Techniques based on constructing complementary p-network often require larger silicon area and they increase the previous stage gate delay due to greater gate input capacitance.

In all, simple feedback keeper is the only general purpose technique that improve dynamic logic gate noise immunity against all types of noise without significant increase in silicon area (device count), speed, and power consumption.

The three-terminal device may be a transistor such as a resonant tunneling transistor.

The circuitry may include an inverter connected to the transistor.

The circuitry may include a transistor connected to the two-terminal device. The circuitry may further include an inverter connected to the transistor.

The device may be a resonant tunneling device.

Further in carrying out the above object and other objects of the present invention, a dynamic circuit having a power supply node and a precharge node is provided. The improvement includes circuitry connected to the nodes. The circuitry

TABLE 1

Comparison of Existing Dynamic Circuit Noise Tolerance Enhancing Techniques

| Class | Technique | Ref. | Num. tran. | Input load[a] | Clock load[a] | Dischrg Path[a] | DC current[a] | All noises[a] | All Func[a] |
|---|---|---|---|---|---|---|---|---|---|
| A | Always-on keeper | [3] | N | o | o | o | x | o | o |
|   | Feedback keeper | [4] | N | o | o | o | o | o | o |
|   | HS feedback keeper | [5] | N | o | o | o | o | x | o |
|   | Conditional feedback keeper | [7] | N | o | o | o | o | x | o |
| B | Precharge internal nodes | [9] | 2N | o | x | o | o | x | o |
|   | Partial precharge | [10] | N | o | x | o | o | x | o |
| C | PMOS pull-up | [11] | N | o | o | o | x | o | o |
|   | NMOS pull-up (feedback) | [12] | N | o | o | o | x | o | o |
|   | Mirror technique | [13] | 2N | x | o | x | o | o | o |
|   | Twin transistor | [15] | 2N | x | o | o | o | o | x |
| D | Complementary p-network | [17] | 2N | x | o | o | o | o | o |
|   | CMOS inverter | [19] | 2N | x | o | o | o | o | x |
|   | Gated CMOS inverter | [20] | 2N | x | o | o | o | o | x |
|   | Triple transistor | [21] | 3N | x | o | x | o | o | o |

[a]Symbol o represents "good" and symbol x represents "not good."

SUMMARY OF THE INVENTION

An object of the present invention is to provide improved dynamic circuits having improved noise tolerance and method for designing same, while incurring little overhead in area (i.e., device count), circuit speed and power consumption.

In carrying out the above object and other objects of the present invention, a method for designing keeper circuitry for dynamic circuits is provided. The method includes providing a keeper circuitry description wherein the keeper circuitry described by the keeper circuitry description has a circuit path through the keeper circuitry. The method also includes substantially maximizing peak current along the circuit path to improve noise tolerance of the dynamic circuit and substantially minimizing average current along the circuit path to reduce performance overhead due to the keeper circuitry.

The circuitry may include a pair of crossed-coupled transistors.

The circuitry may further include a device which has an AC current-voltage characteristic that exhibits a negative differential resistance property.

The device may be a two-terminal device or a three-terminal device.

The two-terminal device may be a diode such as a tunneling diode. The tunneling diode may be a resonant tunneling diode.

has an AC current-voltage characteristic between the nodes that exhibits a negative differential resistance property to improve noise tolerance of the circuit.

Yet still further in carrying out the above object and other objects of the present invention, a circuit including a dynamic combinational or sequential logic circuit having a precharge node and a keeper circuit having a first terminal connected to the precharge node and a second terminal connected to a power supply network is provided. The keeper circuit has no current between the first and second terminals when the voltage across the keeper circuit is zero, and has no current between the first and second terminals when the voltage across the keeper circuit is a power supply voltage. The keeper circuit has an AC current-voltage characteristic between the first and second terminals that has one or more negative differential resistance regions.

The second terminal of the keeper circuit may be connected to a ground network.

Still further in carrying out the above object and other objects of the present invention, a circuit including a dynamic combinational or sequential logic circuit having a precharge node and a keeper circuit having a first terminal connected to the precharge node, a second terminal connected to a power supply network, and a third control terminal is provided. The keeper circuit has no current between the first and second terminals when the voltage across the keeper circuit is zero, and no current between the first and second terminals when the third control terminal is at a predefined voltage level. The keeper circuit has an AC current-voltage characteristic between the first and second terminals that has one or more negative differential resistance regions.

The second terminal of the keeper circuit may be connected to a ground network.

Yet still further in carrying out the above object and other objects of the present invention, a circuit including a dynamic combinational or sequential logic circuit having a precharge node and a keeper circuit connected between the precharge node and a power supply network is provided The keeper circuit includes a two-terminal NDR device having a first terminal connected to the precharge node and a second terminal connected to a first internal node. The keeper circuit further includes a field-effect transistor having a first terminal connected to the first internal node, a second terminal connected to a power supply node and a third terminal connected to a second internal node.

The NDR device may be a tunnel diode, or may be a resonant tunneling diode.

The circuit may further include an inverter having an input connected to the precharge node and an output connected to the second internal node.

The NDR device may be a tunnel diode, or other semiconductor device having the negative differential resistance property.

Still further in carrying out the above object and other objects of the present invention, a circuit including a dynamic combinational or sequential logic circuit having a precharge node and a keeper circuit connected between the precharge node and a power supply network is provided. The keeper circuit includes a three-terminal NDR device having a first terminal connected to the precharge node and a second terminal connected to a power supply node.

The NDR device may be a resonant tunneling transistor.

The keeper circuit may include an inverter having an input connected to the precharge node and an output connected to an internal node. The NDR device may have a third terminal connected to the internal node.

A third terminal of the NDR device may be connected to an output of the circuit.

The NDR device may be a semiconductor device having a negative differential resistance property.

Yet still further in carrying out the above object and other objects of the present invention, a circuit including a dynamic combinational or sequential logic circuit having a precharge node and a keeper circuit connected between the precharge node and a power supply network is provided. The keeper circuit includes a first field effect transistor having a first terminal connected to the precharge node, a second terminal connected to an internal node, and a third terminal connected to the power supply network. The keeper circuit further includes a second field-effect transistor having a first terminal connected to the internal node, a second terminal connected to the power supply network, and a third terminal connected to the precharge node.

The third terminal of the first field-effect transistor may be connected to a ground node or a constant voltage source.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

In general, this invention is about design methodology and circuit implementations of a novel class of keepers for improving the noise tolerance of dynamic logic circuits. The circuit techniques described herein have the following advantages:

1. It improves dynamic circuit noise tolerance against all types of noises including, but not limited to, charge sharing noise, leakage noise, input noise (mainly due to interconnect coupling), power and ground noise, and substrate noise.
2. It has very limited overhead. The keeper typically includes only 2–4 devices. The area overhead can be negligible in wide fan-in dynamic logic gates.
3. Its speed overhead is considerably smaller in comparison with prior techniques. The noise tolerance of dynamic logic circuits can be improved to the level of static logic circuits with a delay overhead of only 10%.
4. Dynamic logic gates using the keeper disclosed in this invention consume no DC power. Further, the AC power consumption is smaller than prior feedback keeper-based circuits.
5. Dynamic logic gates will have variable noise tolerance that can be adjusted by sizing the disclosed keeper in this invention.
6. This invention can be easily incorporated into existing cell design flow because the modification is limited to the keeper only while the rest of the dynamic logic gate is unchanged.

In one embodiment of the present invention, keeper circuitry includes a resonant tunneling diode having a first terminal connected to a dynamic node in a dynamic logic circuit and a second terminal connected to a first internal node, a field-effect transistor having a first terminal connected to the first internal node, a second terminal connected to the power supply node, and a third terminal connected to a second internal node, and an inverter having input connected to the dynamic node and output connected to the second internal node.

In another embodiment of the present invention, keeper circuitry includes a resonant tunneling, transistor having a first terminal connected to a dynamic node in a dynamic logic circuit, a second terminal connected to the power supply node, and a third terminal connected to an internal node, and an inverter having input connected to the dynamic node and output connected to the internal node.

In yet another embodiment of the present invention, keeper circuitry includes a first field-effect transistor having a first terminal connected to a dynamic node in a dynamic logic circuit, a second terminal connected to an internal node, and a third terminal connected to the power supply node, and a second field-effect transistor having a first terminal connected to the internal node, a second terminal connected to the power supply network, and a third terminal connected to the dynamic node.

In further embodiments of the present invention, keeper circuitry has a first terminal connected to a dynamic node of a dynamic logic circuit and a second terminal connected to the power supply network, the keeper circuitry having an AC current-voltage characteristic that exhibits a negative differential resistance property.

The performance overhead due to the additional keeper circuitry that helps improve dynamic circuit noise immunity cannot be completely eliminated. However, it can be reduced to a large extent. In the present invention, a new method and accompanying apparatus is described that enhances dynamic gate noise immunity against all sources of noises while incurring very little cost in circuit performance.

First, the noise tolerance versus speed or performance conundrum needs to be examined. It may be observed that there is an ambiguity in the definition of the strength of the keeper. The keeper strength that determines gate noise tolerance is not necessarily the same as the keeper strength that governs the gate performance. The keeper strength can be measured in terms of the current supplied by the keeper.

Keeper strength that determines gate speed is approximately the average current when the applied voltage across the keeper is in the range $[0, V_{DD}/2)$; this current can be formulated as:

$$I_{sp} = \frac{2}{V_{DD}} \int_0^{V_{DD}/2} I(V) \cdot dV,$$

where V is the voltage across the keeper, I(V) is the AC current through the keeper, and $V_{DD}$ is the power supply voltage.

Keeper strength that determines gate noise tolerance is the small-signal maximum current, defines as:

$$I_{nm} = \max_{0 \leq V \leq V_D} (I(V)),$$

where $V_D$ is the maximum allowed voltage deviation from the ideal voltage value at the dynamic node 111 (i.e., FIG. 1) without causing noise violation and in practice it is often much smaller than half of the power supply voltage.

It is the difference between keeper strength for gate performance $I_{sp}$ and keeper strength for gate noise immunity $I_{nm}$ that makes it possible to enhance the noise tolerance of a dynamic logic gate while still retaining its performance. The spirit of the present invention is therefore to use a keeper that has large $I_{nm}$ value and, at the same time, a small $I_{sp}$ value.

However, it can be shown that if the current voltage characteristic of the keeper is monotonous, the ratio between the delay keeper strength $I_{sp}$ and the noise keeper strength $I_{nm}$ has a loose lower bound of $1-2\, V_D/V_{DD}$. (See, Ding and Mazumder, "On Circuit Techniques to Improve Noise Immunity of CMOS Dynamic Logic," IEEE TRANSACTIONS ON VLSI SYSTEMS, to appear, 2004, for proof and more detailed discussion.) For the prior feedback keepers like the one used in circuit 100 of FIG. 1, the delay keeper strength $I_{sp}$ is often comparable to, if not greater than, the noise keeper strength, $I_{nm}$. Therefore, they are not desirable in this application.

On the other hand, if the AC current-voltage characteristic of the keeper is not monotonous, that is, it has one or more regions where the differential resistance is negative (i.e., a small increase in the voltage across the keeper causes the current through the keeper to decrease), the noise keeper strength $I_{nm}$ can be significantly larger than the delay keeper strength $I_{sp}$.

Figure 2:
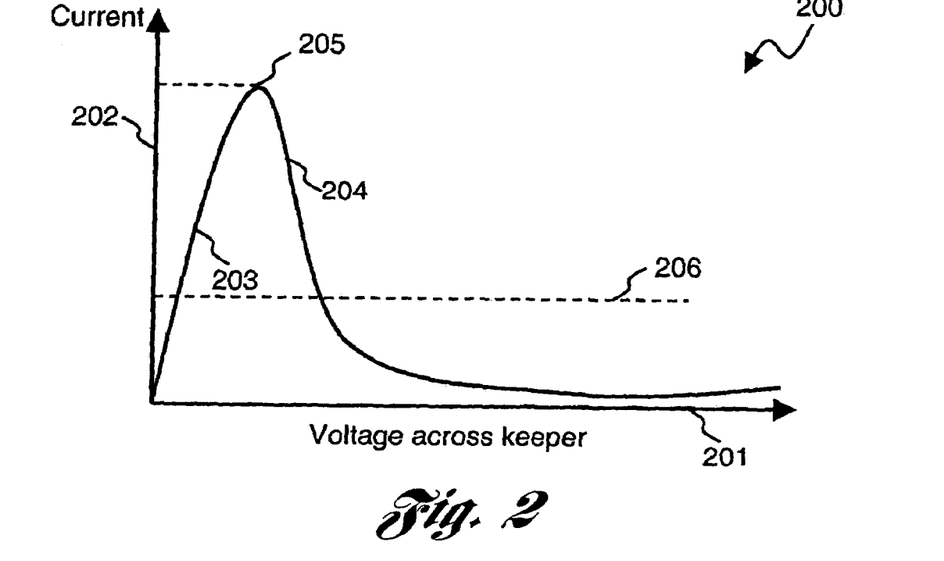
FIG. 2 is a graph of current versus voltage across a keeper circuit of the present invention wherein the current-voltage characteristic has a negative differential resistance region.

FIG. 2 represents a graphical depiction of a possible non-monotonous keeper current-voltage characteristic 200 of the present invention. The x-axis 201 is the voltage across the keeper The y-axis 202 is the current through the keeper. The current-voltage characteristic 200 consists of a positive differential resistance region 203 and a negative differential resistance region 204. Using a keeper of the present invention with such a current-voltage characteristic, the small signal maximum current 205 of the keeper can be significantly larger than the average keeper current 206. Therefore, dynamic circuit noise tolerance can be greatly improved without proportionally large increase in gate delay.

Figure 3:
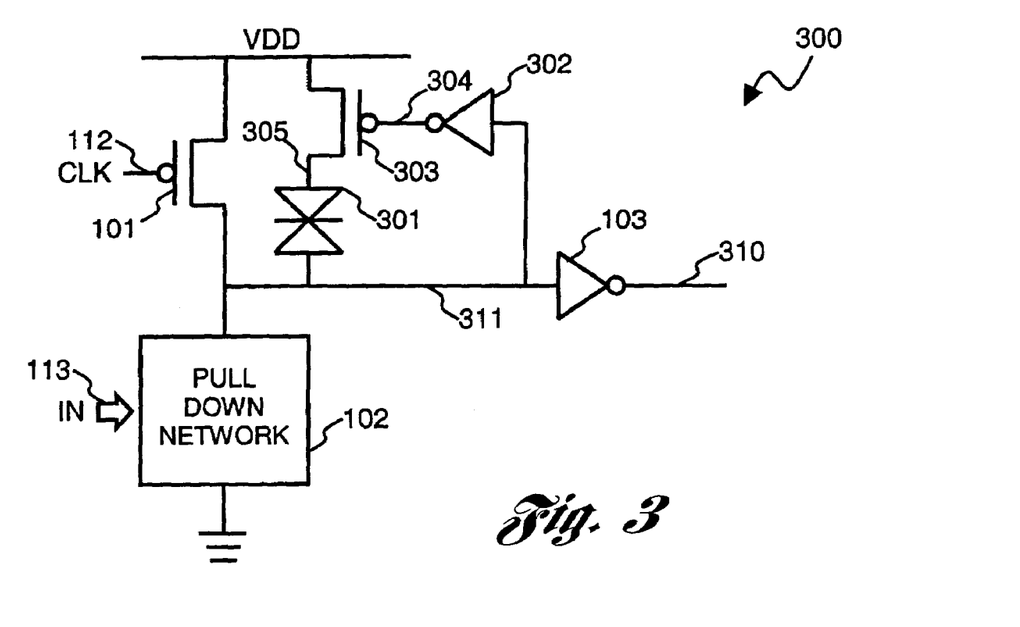
FIG. 3 is a circuit diagram of one embodiment of keeper circuitry of the present invention including a resonant tunneling diode, a MOS transistor, and a CMOS inverter.

FIG. 3 is a circuit diagram of a dynamic circuit having a keeper with non-monotonous current-voltage characteristic according to the present invention. The keeper includes a resonant tunneling diode (i.e. RTD) 301, a CMOS inverter 302, and a p-type pull-up transistor 303. Resonant tunneling diodes (RTDs) are semiconductor devices with intrinsic negative differential resistance (NDR) property. It is noted that other types of tunnel diodes, such as Esaki tunnel diodes, and other two-terminal devices having one or more negative differential resistance regions in their current voltage characteristic could be used in place of the RTD 301 for the present invention.

The operation of the circuit 300 depicted in FIG. 3 is as follows. In the precharge phase when the clock 112 is low, the dynamic node 311 is precharged high and the feedback node 304 is low. Hence, the PFET 303 is O$_N$ and the RTD 301 operates in the first positive differential resistance region 203. The circuit 300 enters the evaluate phase when CLK 112 switches high. The RTD 301 stays in the first positive differential resistance region 203 until the input voltage 113 to the pull-down network 102 is high enough such that the discharge current exceeds the peak current of the RTD 301. After this point, the dynamic gate 300 starts to accelerate in switching because the combined effect of increase in discharge current and the decrease in the pull-up current through the RTD 301. After the dynamic node 311 drops to a certain low voltage value, the voltage at the feedback node 304 rises and switches off PFET 303 allowing the dynamic node 311 to fully reach the ground voltage.

Figure 4:
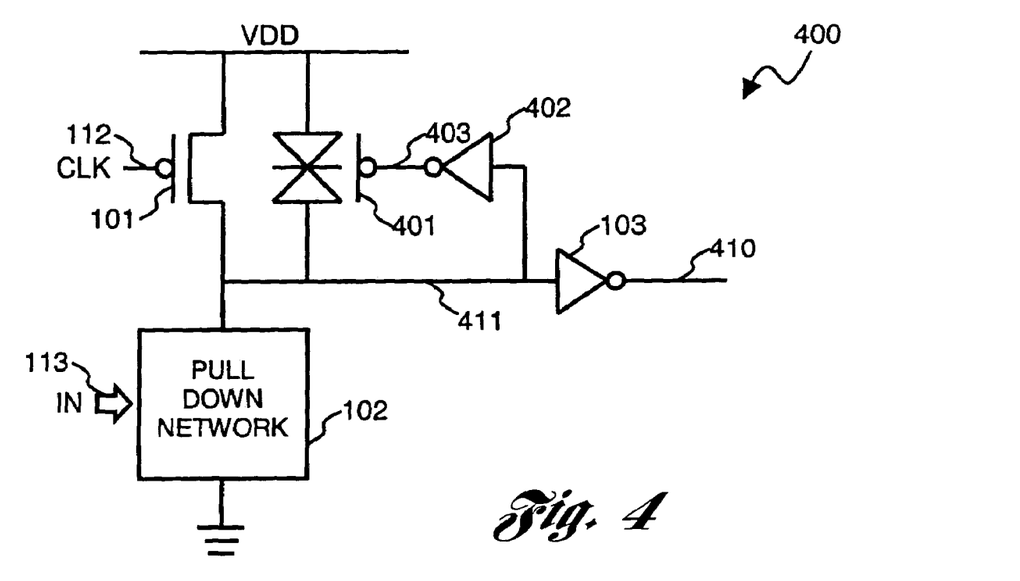
FIG. 4 is a circuit diagram of another embodiment of keeper circuitry of the present invention including a resonant tunneling transistor and an inverter.

Alternatively, three-terminal NDR devices like resonant tunneling transistors, resonant hot electron transistors, etc., can also be used as keepers according to the present invention. FIG. 4 is a circuit diagram of an embodiment of such a keeper employed in a domino logic gate. The keeper includes a resonant tunneling transistor 401 and an inverter 402. The operation of this circuit 400 is similar to that of circuit 300.

Figure 5:
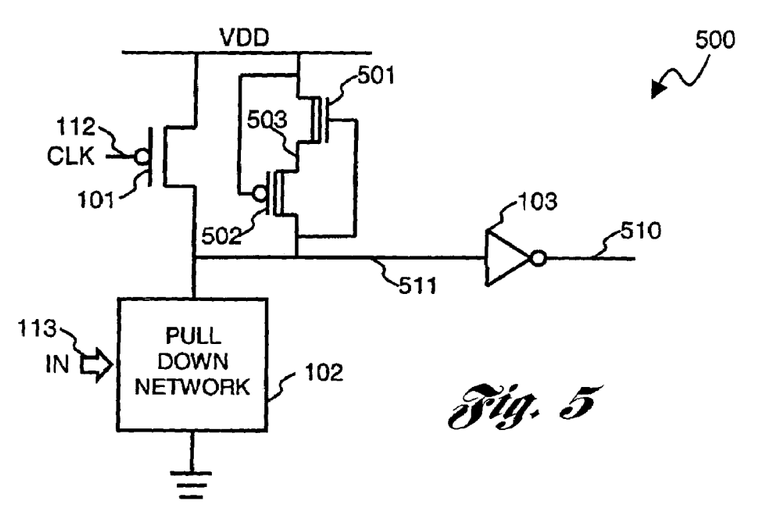
FIG. 5 is a circuit diagram of yet another embodiment of keeper circuitry of the present invention including two depletion-mode MOSFET devices.

Circuits designed using MOSFET devices that exhibit the NDR property have been studied extensively in the literature (see, for example, [23]–[24]). Those existing NDR circuits constitute a pool of potential circuit realizations of MOS- FET-based keepers according to the present invention. In FIG. 5, an embodiment is shown of one of such MOSFET-based NDR keeper employed in a domino dynamic logic gate according to the present invention.

The NDR keeper circuit in FIG. 5 includes a depletion-mode, n-type FET 501 and a depletion-mode, p-type FET 502. Since the gate of NFET 501 is connected to the dynamic node 511, the current through the two transistors 501 and 502 will be cut off immediately when the voltage at the dynamic node 511 drops below the turn-off voltage of the NFET 501. In this particular setup, the gate of transistor 502 connects to a constant voltage source, the power supply node. Therefore, one can alternatively use an enhancement-mode, p-type FET whose gate is connected to the ground node in the place of the depletion-mode PFET 502.

Figure 6:
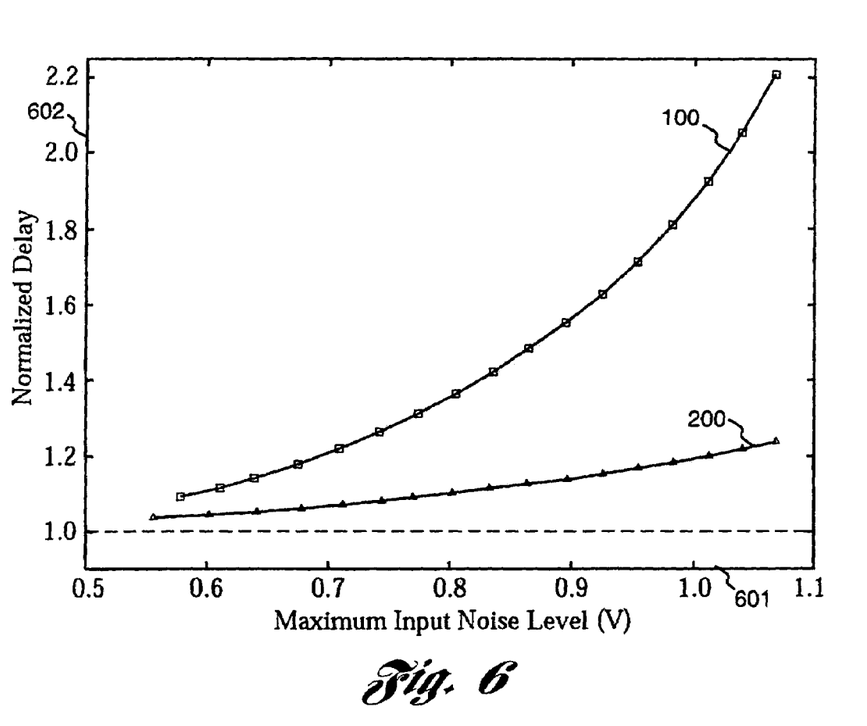
FIG. 6 is a graph of normalized gate delay versus gate noise tolerance level curves for dynamic logic circuits employing different types of keeper circuitry.

FIG. 6 represents a graphical depiction of the delay versus noise immunity curves of the dynamic logic circuit with a conventional feedback keeper 100 of FIG. 1 and the dynamic logic gate with RTD+FET keeper 300 of FIG. 3, according to the present invention. The circuits are 8-input domino OR gate designed in a 0.18 micron process technology. The simulation is carried out using HSPICE at 1.6 V power supply voltage and at a temperature of 55° C. The load capacitance of the gate is 50 fF and the clock frequency used in the simulation is 500 MHz. The x-axis 601 represents the maximum input noise level in Volts that the circuit can withstand. The y-axis 602 represents gate delay normalized to the gate delay of the same circuit without any keeper. It is clear that at the same noise immunity level, domino logic circuit 300 has significantly reduced performance overhead in comparing with the conventional circuit design 100. When the gate delays are identical, the domino logic circuit 300 has significantly higher noise immunity than the conventional circuit design 100. It is also evident that the performance benefit of using the method disclosed in this invention is even greater when the noise-tolerant requirement is high.

Figure 7:
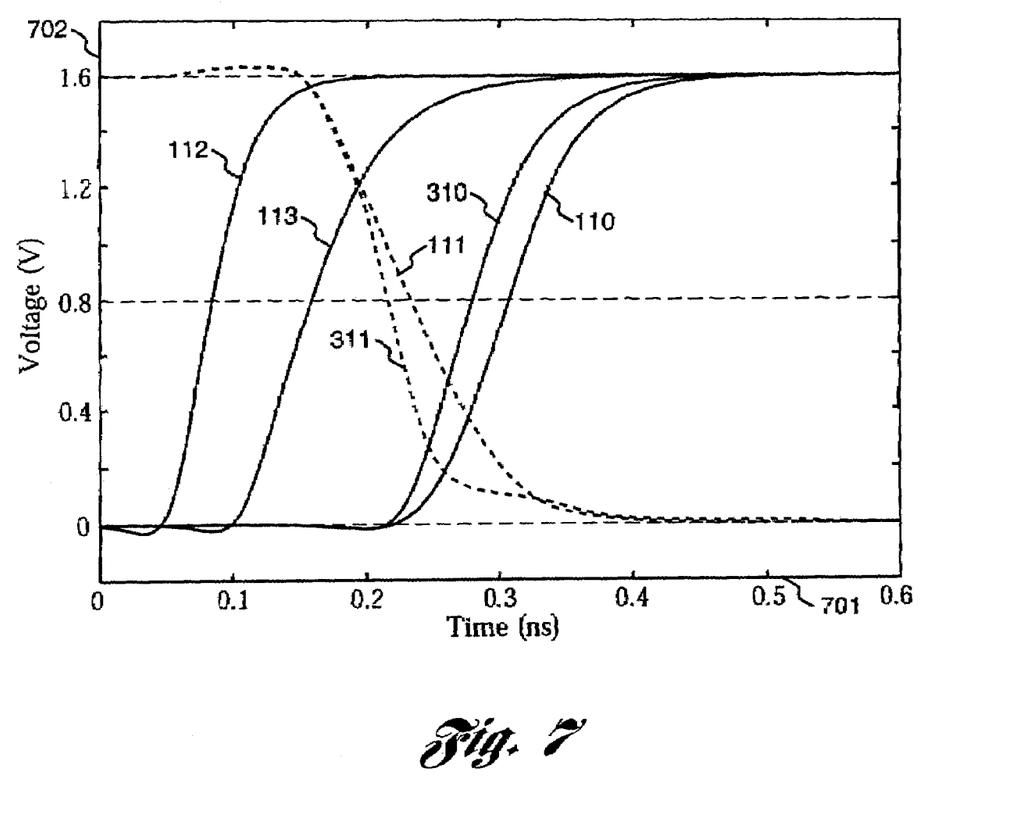
FIG. 7 is a graph of voltage versus time for transient voltage waveforms of dynamic logic circuits employing different types of keeper circuitry.

FIG. 7 represents a graphical depiction of the transient waveforms of the dynamic logic circuit with conventional feedback keeper 100 of FIG. 1, and the dynamic logic gate with RTD+FET keeper 300 of FIG. 3, according to the present invention. The x-axis 701 represents time in nanoseconds (ns) and the y-axis 702 represents the voltage values of the circuit nodes in Volts. The dynamic nodes 111 and 311 discharge approximately at the same rate initially. The main difference is 311 has an accelerated discharge process after the voltage drops below about 1.2 V, in this case due to the reduced current through the resonant tunneling diode 301. Therefore, in addition to the reduction in the delay between the input 113 and the dynamic node 111, the delay between the dynamic node 111 and the gate output 110 is also decreased because of the faster input slew seen by the output driver 103. In this case, circuit 300 depicted in FIG. 3 is over 20% faster than circuit 100 depicted in FIG. 1.

The performance of dynamic logic gates with different keepers has been compared by designing a set of wide fan-in multiplexers (MUXes). The number of inputs of the MUXes ranges from 8 to 32. Circuit performance comparisons in terms of both gate delay and power consumption are shown in Table 2, where the percentage values represent the percentage increase in gate delay in comparison to bare domino gates without any keeper.

TABLE 2

Performance Comparison at Same Noise Tolerance Level

| Noise Level (V) | MUX (bit) | Prior Keeper | | Proposed Keeper | |
|---|---|---|---|---|---|
| | | Delay (ps) | Power ($\mu$W) | Delay (ps) | Power ($\mu$W) |
| 0.6 | 8  | 136.7 | 11.7%  | 145.8 | 127.1 | 3.8%  | 147.4 |
|     | 16 | 159.5 | 10.1%  | 160.9 | 150.0 | 3.5%  | 161.5 |
|     | 32 | 203.1 | 9.4%   | 192.7 | 191.6 | 3.2%  | 191.4 |
| 0.7 | 8  | 150.5 | 23.0%  | 156.0 | 129.9 | 6.1%  | 153.8 |
|     | 16 | 176.2 | 21.6%  | 172.5 | 153.2 | 5.7%  | 168.0 |
|     | 32 | 223.9 | 20.6%  | 206.9 | 196.0 | 5.6%  | 197.9 |
| 0.8 | 8  | 175.6 | 43.5%  | 173.4 | 134.3 | 9.7%  | 161.9 |
|     | 16 | 204.4 | 41.1%  | 192.3 | 158.3 | 9.2%  | 176.4 |
|     | 32 | 258.7 | 39.4%  | 231.6 | 202.9 | 9.3%  | 206.5 |
| 0.9 | 8  | 220.2 | 79.9%  | 204.2 | 139.6 | 14.1% | 177.4 |
|     | 16 | 254.6 | 75.7%  | 227.6 | 164.3 | 13.4% | 182.2 |
|     | 32 | 320.9 | 72.9%  | 275.9 | 210.6 | 13.5% | 222.8 |
| 1.0 | 8  | 333.7 | 172.6% | 282.6 | 146.8 | 19.9% | 196.6 |
|     | 16 | 383.1 | 164.4% | 318.4 | 172.4 | 19.0% | 211.5 |
|     | 32 | 479.6 | 158.4% | 392.2 | 221.4 | 19.3% | 242.7 |

Overall, the proposed keeper of the present invention is consistently and significantly better than the prior feedback keeper in preserving the performance of dynamic logic gates when gate noise tolerance is tuned up. Furthermore, it can also be observed from the table that the advantage of the proposed keeper is more evident when the gate noise tolerance requirement is high. At high noise tolerance levels, MUXes with the prior keeper have a delay which is more than double the delay of the corresponding gates without any keeper. The delay penalty for the proposed keepers, on the other hand, is less than 20%. This suggests that it will be more rewarding to use the technique described herein as the process technology continues to scale down aggressively and the noise problem assumes more prominence in noise-aware design methodologies.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A circuit comprising:
   a dynamic combinational or sequential logic circuit having a precharge node; and
   a keeper circuit having a first terminal connected to the precharge node, a second terminal connected to a power supply network, and a third control terminal, the keeper circuit:
      having no current between the first and second terminals when the voltage across the keeper circuit is zero;
      having no current between the first and second terminals when the third control terminal is at a predefined voltage level; and
      having an AC current-voltage characteristic between the first and second terminals that has one or more negative differential resistance regions.

2. The circuit of claim 1, where the second terminal of the keeper circuit is connected to a ground network.

3. A circuit comprising:
   a dynamic combinational or sequential logic circuit having a precharge node; and a keeper circuit connected between the precharge node and a power supply network, the keeper circuit comprising:
a first field effect transistor having a first terminal connected to the precharge node, a second terminal connected to an internal node, and a third terminal connected to the power supply network; and
a second field-effect transistor having a first terminal connected to the internal node, a second terminal connected to the power supply network, and a third terminal connected to the precharge node.

4. The circuit of claim 3, wherein the third terminal of said first field-effect transistor is connected to a ground node of the network.

5. The circuit of claim 3, wherein the third terminal of the first field-effect transistor is connected to a constant voltage source.

6. A method for designing keeper circuitry for dynamic circuits, the method comprising:
providing a keeper circuitry description wherein keeper circuitry described by the keeper circuitry description has a circuit path through the keeper circuitry and includes a pair of crossedcoupled transistors
substantially maximizing peak current along the circuit path to improve noise tolerance of the dynamic circuit; and
substantially minimizing average current along the circuit path to reduce performance overhead due to the keeper circuitry.

7. The method as claimed in claim 6, wherein the circuitry includes a three-terminal transistor which has an AC current-voltage characteristic that exhibits a negative differential resistance property, and wherein the circuitry includes an inverter connected to the transistor.

8. The method as claimed in claim 6, wherein the circuitry includes a two-terminal device which has an AC current-voltage characteristic that exhibits a negative differential resistance property, and wherein the circuitry includes a transistor connected to the two-terminal device and an inverter connected to the transistor.

9. A circuit comprising:
a dynamic combinational or sequential logic circuit having a precharge node;
a keeper circuit connected between the precharge node and a power supply network, the keeper circuit comprising:
a two-terminal NDR device having a first terminal connected to the precharge node and a second terminal connected to a first internal node; and
a field-effect transistor having a first terminal connected to the first internal node, a second terminal connected to the power supply node, and a third terminal connected to a second internal node; and
an inverter having an input connected to the precharge node and an output connected to the second internal node.

10. The circuit of claim 9, wherein the NDR device is a tunnel diode.

11. The circuit of claim 9, wherein the NDR device is a semiconductor device having a negative differential resistance property.

12. The circuit of claim 9, wherein the NDR device is a resonant tunneling diode.

13. A circuit comprising:
a dynamic combinational or sequential logic circuit having a precharge node;
a keeper circuit connected between the precharge node and a ground network, the keeper circuit comprising:
a two-terminal NDR device having a first terminal connected to the precharge node and a second terminal connected to a first internal node; and
a field-effect transistor having a first terminal connected to the first internal node, a second terminal connected to the ground network, and a third terminal connected to a second internal node; and
an inverter having an input connected to the precharge node and an output connected to the second internal node.

14. A circuit comprising:
a dynamic combinational or sequential logic circuit having a precharge node; and
a keeper circuit connected between the precharge node and a power supply network, the keeper circuit comprising:
a three-terminal NDR device having a first terminal connected to the precharge node and a second terminal connected to a power supply node; and
an inverter having an input connected to the precharge node and an output connected to an internal node.

15. The circuit of claim 14, wherein the NDR device has a third terminal connected to the internal node.

16. The circuit of claim 14, wherein the NDR device has a third terminal connected to an output of the circuit.

17. The circuit of claim 16, wherein the NDR device is a semiconductor device having a negative differential resistance property.

18. The circuit of claim 16, wherein the NDR device is a resonant tunneling transistor.

19. A circuit comprising:
a dynamic combinational or sequential logic circuit having a precharge node; and
a keeper circuit connected between the precharge node and a ground network, the keeper circuit comprising:
a three-terminal NDR device having a first terminal connected to the precharge node and a second terminal connected to the ground network; and
an inverter having an input connected to the precharge node and an output connected to an internal node.

20. A circuit comprising:
a dynamic combinational or sequential logic circuit having a precharge node; and
a keeper circuit having a first terminal connected to the precharge node, a second terminal connected to a power supply network having a power supply voltage, the keeper circuit:
having no current between the first and second terminals when the voltage across the keeper circuit is zero;
having no current between the first and second terminals when the voltage across the keeper circuit is the power supply voltage; and
having an AC current-voltage characteristic between the first and second terminals that has one or more negative differential resistance regions.

21. The circuit of claim 20, where the second terminal of the keeper circuit is connected to a ground network.

* * * * *